US011271527B2

(12) United States Patent
Wang

(10) Patent No.: US 11,271,527 B2
(45) Date of Patent: Mar. 8, 2022

(54) BROADBAND HARMONIC LOAD MODULATION DOHERTY AMPLIFIERS

(71) Applicant: Telefonaktiebolaget LM Ericsson (publ), Stockholm (SE)

(72) Inventor: Zhancang Wang, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 22 days.

(21) Appl. No.: 16/968,870

(22) PCT Filed: Feb. 11, 2018

(86) PCT No.: PCT/CN2018/076225
§ 371 (c)(1),
(2) Date: Aug. 10, 2020

(87) PCT Pub. No.: WO2019/153290
PCT Pub. Date: Aug. 15, 2019

(65) Prior Publication Data
US 2021/0013839 A1 Jan. 14, 2021

(51) Int. Cl.
*H03F 1/02* (2006.01)
*H03F 1/56* (2006.01)
*H03F 3/21* (2006.01)

(52) U.S. Cl.
CPC ............ *H03F 1/0288* (2013.01); *H03F 1/56* (2013.01); *H03F 3/211* (2013.01); *H03F 2200/222* (2013.01); *H03F 2200/387* (2013.01); *H03F 2200/451* (2013.01)

(58) Field of Classification Search
CPC .......... H03F 1/0288; H03F 1/56; H03F 3/211; H03F 2200/222; H03F 2200/387; H03F 2200/451

USPC ......................................................... 330/295
See application file for complete search history.

(56) References Cited

U.S. PATENT DOCUMENTS

| 9,209,511 | B2 | 12/2015 | Mei |
| 2005/0231286 | A1 | 10/2005 | Gotou et al. |
| 2011/0175677 | A1 | 7/2011 | Jeong et al. |

(Continued)

FOREIGN PATENT DOCUMENTS

| CN | 103457541 A | 12/2013 |
| CN | 107425814 A | 12/2017 |
| EP | 1959563 A2 | 8/2008 |

(Continued)

OTHER PUBLICATIONS

Yang et al., "A 1.8-2.3 GHz Broadband Doherty Power Amplifier with a Minimized Impedance Transformation Ratio", IEEE, 2015, 3 pages.

(Continued)

*Primary Examiner* — Hafizur Rahman
(74) *Attorney, Agent, or Firm* — NDWE LLP

(57) ABSTRACT

A Doherty power amplifier comprises a splitter network, a first amplifier path comprising at least a first sub-amplifier and a first output matching network; and a second amplifier path comprising at least a second sub-amplifier amplifier and a second output matching network. The Doherty power amplifier further comprises a load modulation network comprising four transmission lines. Each transmission line is a quarter wavelength line at a fundamental frequency of the input signal.

20 Claims, 4 Drawing Sheets

(56) References Cited

U.S. PATENT DOCUMENTS

2020/0259460 A1* 8/2020 Wang ................ H03F 3/211

FOREIGN PATENT DOCUMENTS

EP      3043469 A1    7/2016
EP      3046253 A1    7/2016

OTHER PUBLICATIONS

Zhang et al., "Multi-Harmonic Tuning Behavior of MOSFET RF power Amplifiers", Thif-39, 2001, IEEE, pp. 2147-2150.

International Search Report and Written Opinion for International Application No. PCT/CN2018/076225, dated Nov. 12, 2018, 7 pages.

K. W. Eccleston et al., "A Compact Class-F/Class-C Doherty Amplifier," Jul. 2011, pp. 1606-1610, Microwave and Optical Technology Letters, vol. 53, No. 7.

K. W. Eccleston et al., "Harmonic load modulation in Doherty amplifiers," Jan. 17, 2008, 2 pages, Electronics Letters, vol. 44, No. 2.

* cited by examiner

BROADBAND HARMONIC LOAD MODULATION DOHERTY AMPLIFIERS

CROSS-REFERENCE TO RELATED APPLICATIONS

This application is a National stage of International Application No. PCT/CN2018/076225, filed Feb. 11, 2018, which is hereby incorporated by reference.

TECHNICAL FIELD

Embodiments herein relate to power amplifiers. In particular, they relate to a Doherty power amplifier with broadband harmonic load modulation, an electronic circuit and an apparatus comprising the Doherty power amplifier.

BACKGROUND

Power amplifiers (PA) are ubiquitous in wireless communication equipment or device. The efficiency of radio frequency (RF) PA is generally defined as a ratio between the desired transmitted radio power and the total power from a supply, which is rather low in the future wideband applications with traditional PA architectures. Consequently, extensive efforts are made within the wireless communication industry for the means of enhancing efficiency. A small improvement in PA efficiency can make substantial profit available in a wireless communication system or terminal and cut the overall costs needed to operate the system or terminal.

In cellular base stations of 4G and beyond, advanced digital modulation schemes are used for high spectrum efficiency. The RF signal exhibits a large peak to average power ratio (PAPR), which is amplified simultaneously in a PA. Therefore, the instantaneous transmit power will vary extensively and fast. Traditional RF PA would suffer from rather low average efficiency with high PAPR signal stimulus.

Although a classic Doherty PA meets the efficiency and linearity requirements, it is an inherent narrow-band solution, because of the use of frequency limited quarter wave transmission lines. Therefore, it may not satisfy the broadband requirements with emerging wireless standards. A clear source of limited bandwidth in the Doherty PA is the impedance inverter which connects the carrier and peaking amplifier together. It is essential in the Doherty structure to transform the low common impedance Z0/2 into a higher impedance 2*Z0 seen as the load of the carrier amplifier in the low power range. Also it assists to have a proper active load modulation of higher impedance 2*Z0 into a lower impedance Z0 in the Doherty regime. However, this may be achieved at its center frequency. Any deviation from the center frequency, the impedance inverter is no longer quarter wavelength. Then, the purely resistive load seen by the carrier amplifier changes into a complex load, leading to a non-optimal load modulation as the frequency deviation from the center frequency is enlarged. Similar issues happen to a real-to-real impedance transformer as well. The precision of matching the common load impedance into the final system load impedance may deteriorate owing to limited frequency response.

Harmonic termination has been widely used for compound semiconductor Doherty PAs. However, the complexity of the harmonic control circuitry may require great efforts for development and verification.

There are certain efforts to improve the efficiency performance of Doherty amplifiers by harmonic load modulation techniques, which do not require harmonic control circuitry and simplify the high efficiency PA development.

FIG. 1 shows a Doherty amplifier 100 disclosed in Eccleston K. et. al., "*A Compact Class-F/Class-C Doherty PA*", Microwave and Optical Technology Letters, Vol. 53, No. 7, July, 2011, pp. 1606-1610, and in Eccleston K. et.al., "*Harmonic load modulation in Doherty amplifiers*", Electronics Letters, 2008, Vol. 44, No. 2, pp. 128-129. As shown in FIG. 1, the main/carrier amplifier, denoted as Main FET, was originally class-B mode. However, after the harmonic load modulation effect by the peaking amplifier, Peaking FET, the main amplifier would behave like a class-F mode amplifier, in which the drain bias supplies are connected to the corresponding device drain terminals through the short-circuited quarter-wavelength transmission lines, Doherty line, providing inherent even-harmonic suppression. In this case, the drain current of the class-B biased main FET contains the direct current (DC), fundamental-frequency, and even-harmonic components. On the other hand, the drain current of the class-C biased peaking FET is purely sinusoidal ideally, since its odd-harmonic components are shunted by the short-circuited bias feed quarter wave line connected to the main FET, thus resulting in no harmonics appearing at the peaking FET output. The most advantage of it is that the odd harmonics of the class-C biased peaking FET flow into the main amplifier to achieve a class-F mode operation through a waveform shaping process without individual harmonic termination circuits. Such a scheme takes full advantage of a Doherty structure to incorporate harmonic terminations actively. Therefore, besides increased efficiency, this approach leads to a simplified and compact circuit.

However, the above prior art solution has limited operational bandwidth for broadband applications. The odd harmonic contribution in harmonic termination to output power and power added efficiency is quite limited. Although class-F produced by harmonic load modulation effect in prior art can achieve high efficiency, the effect of output parasitics of the main/carrier FET reduces the quality of the odd-harmonic short-circuit termination at the peaking FET, resulting in power amplifier efficiency degradation.

SUMMARY

It is an object of embodiments herein to provide a power amplifier with improved performance in terms of bandwidth and efficiency.

According to one aspect of embodiments herein, the object is achieved by a Doherty power amplifier arrangement. The Doherty power amplifier arrangement comprises a splitter network configured to split an input signal into a first input signal and a second input signal.

The Doherty power amplifier arrangement further comprises a first amplifier path comprising at least a first sub-amplifier configured to amplify the first input signal and a first output matching network.

The Doherty power amplifier arrangement further comprises a second amplifier path comprising at least a second sub-amplifier amplifier configured to amplify the second input signal and a second output matching network.

The Doherty power amplifier arrangement further comprises a load modulation network. The load modulation network comprises a first transmission line coupled between the first output matching network and a first interconnection node. The load modulation network further comprises a second transmission line coupled between the second output matching network and a second interconnection node. The load modulation network further comprises a third transmission line coupled between the first interconnection node and a power supply, and a fourth transmission line coupled between the first interconnection node and the second interconnection node. Each transmission line is a quarter wavelength line at a fundamental frequency of the input signal, and the second interconnection node is an output terminal of the power amplifier arrangement.

In other words, according to the embodiments herein, the load modulation network comprises four transmission lines to complete both fundamental and harmonic load modulation for the proposed Doherty power amplifier arrangement. Each transmission line is a quarter wave ($\lambda/4$) transmission line at the fundamental frequency. In comparison to prior art, the characteristic impedance of these four transmission lines are very low, e.g. 1~6 Ohm. The transmission lines, i.e. the first, second and fourth transmission lines, coupling the output terminals, i.e. drains of the two sub-amplifiers, are the harmonic load modulation transmission lines. Their characteristic impedances may be set to have a special relationship and combined to realize an impedance conversion such that the output terminal of the power amplifier arrangement has characteristic impedance which is much lower than e.g. 50Ω, and the off-state impedance for the second sub-amplifier, i.e. the peaking amplifier, in the Doherty power amplifier is increased.

The transmission line coupling the output terminals of the two sub-amplifiers, i.e. the fourth transmission line, is the fundamental load modulation transmission line. The third transmission line feeds the power supply to the drains of the first and second sub-amplifiers, via the first and second transmission lines respectively. Therefore, a half wavelength transmission line is formed which presents a short-circuit load for the first sub-amplifier at odd order harmonics. The second/peaking sub-amplifier, on the other hand, has a class-C bias, and its drain current contains both even and odd harmonics, as well as the fundamental and DC component. The even order harmonics are shunted to ground via the second, fourth and third transmission lines, which is a 3*$\lambda/4$ transmission line. Hence, the second/peaking sub-amplifier is short-circuit terminated at all harmonics and this means that no harmonics appear at the amplifier arrangement output. The load modulation network completes an impedance transformation from the output terminals of the first and second amplifiers to specific low impedance for fundamental load modulation at the junction node, i.e. the second interconnection node or the output terminal of the power amplifier arrangement. Then a broadband impedance transformer may be used to transform the low output impedance to typical load impedance, e.g. 50Ω.

Some advantages of the Doherty power amplifier arrangement according to the embodiments herein include:

It provides broadband fundamental and harmonic load modulation at the same time to boost efficiency without any traditional harmonic termination schemes by using very low impedance combination and singular broadband impedance transformer.

It highly uses the 2nd harmonic rather than the 3rd harmonic in prior art to take full advantage and more obvious efficiency enhancement. Usually, the even harmonics, especially the 2nd harmonic may contribute a lot for harmonic termination. However, it was shorted to ground in prior art.

It incorporates the broadband harmonic load modulation network and the output matching networks together for a compact Doherty PA design.

The embodiments herein may be applied to even Doherty, uneven Doherty, symmetric Doherty, asymmetric Doherty, inverted Doherty and multistage Doherty power amplifers.

Therefore, the embodiment herein provides a power amplifier arrangement with improved performance on bandwidth and efficiency.

BRIEF DESCRIPTION OF THE DRAWINGS

Examples of embodiments herein are described in more detail with reference to attached drawings in which.

DETAILED DESCRIPTION

Figure 1:
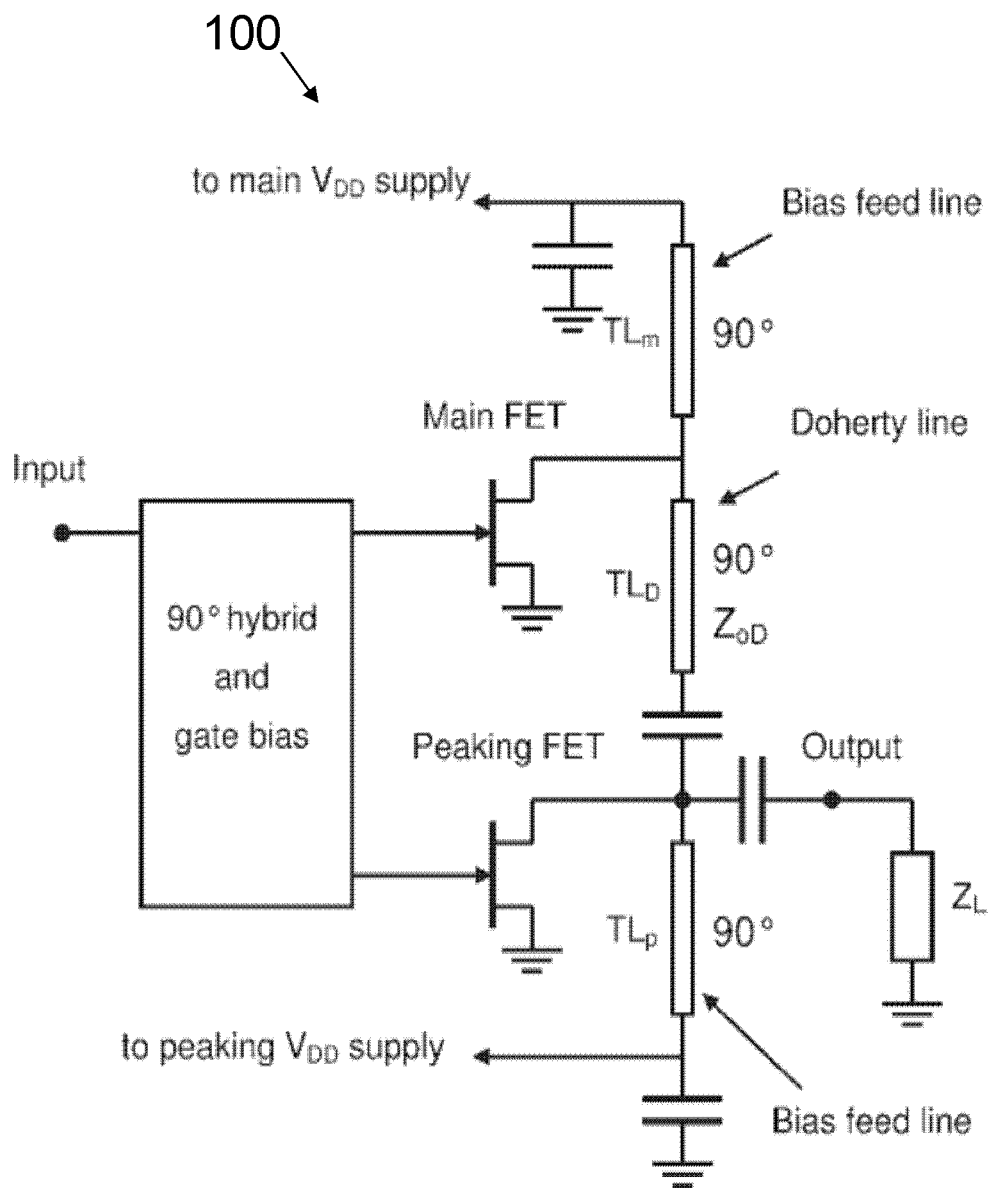
FIG. 1 is a schematic block illustrating a Doherty power amplifier of prior art.
Figure 2:
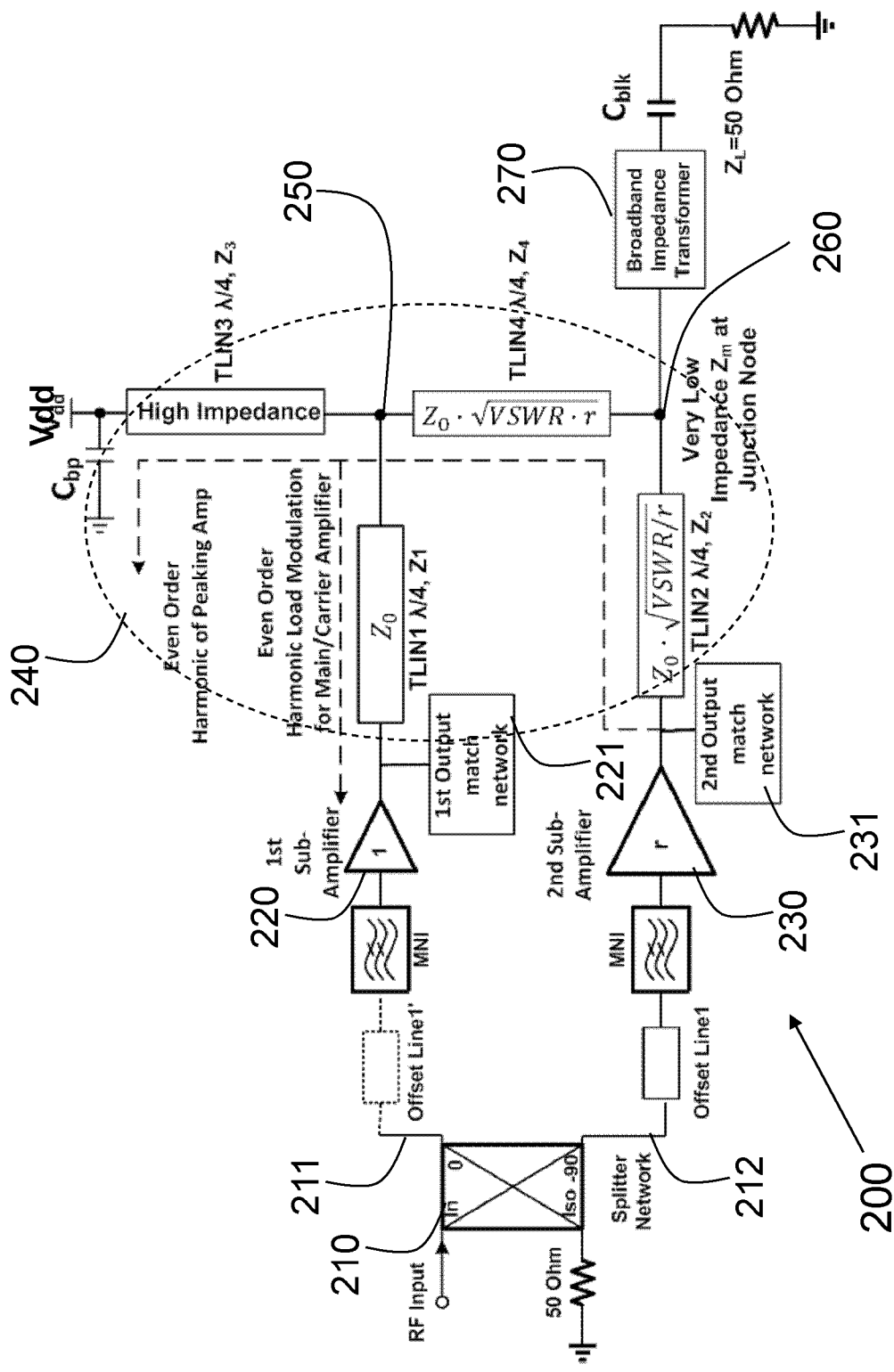
FIG. 2 is a simplified schematic view of a Doherty power amplifier arrangement according to embodiments herein.

FIG. 2 shows a Doherty power amplifier arrangement 200 according to embodiments herein.

The Doherty power amplifier arrangement 200 comprises a splitter network 210, e.g. a quadrature hybrid coupler, configured to split an input signal into a first input signal 211 and a second input signal 212 to provide signals with necessary phase.

The Doherty power amplifier arrangement 200 further comprises a first amplifier path comprising at least a first sub-amplifier 220, i.e. a main/carrier amplifier, configured to amplify the first input signal 211 and a first output matching network 221.

The Doherty power amplifier arrangement 200 further comprises a second amplifier path comprising at least a second sub-amplifier amplifier 230, i.e. a peaking amplifier, configured to amplify the second input signal 212 and a second output matching network 231.

The first output matching network 221 matches a predetermined output impedance of the first sub-amplifier transistor to the input impedance of a first transmission line TLIN1.

The second output matching network 231 matches a predetermined output impedance of the second sub-amplifier transistor to the input impedance of a second transmission line TLIN2.

Offset line 1 and 1' are used to adjust and compensate the phase difference between the first amplifier path and the second amplifier path so that the output power combination can be performed on proper phase base.

The input matching network MNI matches a predetermined input impedance of the sub-amplifier transistor to the output impedance of the splitter network 210.

The Doherty power amplifier arrangement 200 further comprises a load modulation network 240. The load modulation network 240 comprises a first transmission line TLIN1 coupled between the first output matching network 221 and a first interconnection node 250. The load modulation network 240 further comprises a second transmission line TLIN2 coupled between the second output matching network 231 and a second interconnection node 260. The load modulation network 240 further comprises a third transmission line TLIN3 coupled between the first interconnection node 250 and a power supply $V_{dd}$. The load modulation network 240 further comprises a fourth transmission line TLIN4 coupled between the first interconnection node 250 and the second interconnection node 260. Each transmission line is a quarter wavelength line at a fundamental frequency of the input signal. The second interconnection node 260 is an output terminal of the power amplifier arrangement 200.

Therefore the load modulation network 240 comprises four transmission lines to complete both fundamental and harmonic load modulation for the Doherty power amplifier arrangement 200. In comparison to prior art, the characteristic impedance of these four transmission lines are very low, e.g. 1~6 Ohm.

The transmission lines coupling the drains of two sub-amplifiers, i.e. the main/carrier amplifier and the peaking amplifier, are TLIN1, TLIN2 and TLN4, which are the harmonic load modulation transmission lines. According to some embodiments, the first transmission line TLIN1 has a characteristic impedance of $Z_0$, the second transmission line TLIN2 has a characteristic impedance of $Z_0 \cdot \sqrt{VSWR/r}$, the fourth transmission line TLIN4 has a characteristic impedance of $Z_0 \cdot \sqrt{VSWR \cdot r}$. The first, second and fourth transmission lines are combined to realize an impedance conversion such that the output terminal of the power amplifier arrangement 200 has a characteristic impedance of $Z_m = Z_0 \cdot r$, which is much lower than 50Ω, and the off-state output impedance of the second sub-amplifier is increased with a ratio of VSWR·r, wherein r is a power ratio of the second sub-amplifier to the first sub-amplifier, and VSWR is mismatch Voltage Standing Wave Ratio (VSWR) which equals to (r+1).

These three single section quarter wave lines are combined together to realize impedance conversion to $Z_m$, while reducing the impedance transformation ratio. This impedance conversion is targeting to accommodate the other impedance happening in the second/peaking path so that high off-state impedance may be obtained. They will result in a common node impedance of $Zm = Z_0 \cdot r$ by being parallel with the peaking path. Therefore, the common node impedance of the present embodiments is the same as the load impedance so that it can save a real-to-real impedance transformer in comparison to the prior arts.

In the second/peaking path, there is a special single section quarter wave line TLIN2 with characteristic impedance of $Z_0 \cdot \sqrt{VSWR/r}$. This is to enhance off-state impedance for the peaking sub-amplifier, because it converts a $Z_0/r$ value into $Z_0/r \cdot (VSWR \cdot r)$, which indicates it is (VSWR·r) times higher than that value in prior arts. Since VSWR>2 for asymmetric Doherty, it indicates at least two times higher than the off-state impedance value of the prior arts. The benefit of this conversion is that it reduces the first/carrier/main amplifier power leakage to peaking path due to higher off-state impedance. Hence, the actual efficiency of the first/carrier/main sub-amplifier is more approaching to the value in ideal case so that the first carrier/main sub-amplifier efficiency may be enhanced in practice. Furthermore, this kind of enhancement also facilitates broadband performance with a reduced impedance transformation ratio.

The third transmission line TLIN3, feeds the power supply $V_{dd}$ to the drains of the main and peaking sub-amplifiers, via the first transmission line TLIN1 and the second transmission line TLIN2, respectively. The characteristic impedance of the third transmission line is typically high but otherwise arbitrary. The capacitor Cbp has negligible impedance at RF frequencies and either blocks DC or provides RF short-circuit termination for the third quarter wave transmission line TLIN3.

The drain current of the first sub-amplifier 220, i.e. the main/carrier amplifier, which is class-AB/-B biased, contains a direct current (DC) component, the fundamental and even order harmonics. Unlike the prior art, the power supply was connected at drain, the power supply is now fed through a short-circuit load quarter wave length TLIN3 with high impedance first, and then fed through output matching quarter wave line TLIN1 to the drain of the first/main/carrier amplifier 220. Therefore, a half wavelength (λ/2) transmission line TLIN3+TLIN4 is formed which presents a short-circuit load for the first/main/carrier sub-amplifier 220 at odd order harmonics.

Therefore, the first and third transmission lines may form a half wavelength transmission line between an output terminal of the first sub-amplifier 220 and the power supply $V_{dd}$, such that a short-circuit load is presented at the output terminal of the first sub-amplifier 220 for odd order harmonics.

However, at the drain of the first/main/carrier sub-amplifier 220, the even order harmonic exhibits an open-circuit terminated due to the second and fourth transmission lines TLIN2+TLIN4 half wavelength line. Then the first/main/carrier amplifier 220 would behave like a class-$F^{-1}$ mode rather than a class-B mode. So the second and fourth transmission lines TLIN2,TLIN4 may form a half wavelength transmission line such that an open-circuit load is presented at the output terminal of the first sub-amplifier 220 for even order harmonics.

The second/peaking sub-amplifier 230, on the other hand, has a class-C bias, and its drain current contains both even and odd order harmonics, as well as the fundamental and DC component. Unlike the main/carrier amplifier, the odd order harmonics of the peaking amplifier cannot be shunted to ground by a λ/2 transmission line nearby but the even order harmonics are shunted to ground via TLIN2+TLIN4+TLIN3, which is a 3*λ/4 transmission line. Hence, the peaking amplifier 230 is short-circuit terminated at all harmonics and means that no harmonics appear at the power amplifier arrangement 200 output terminal 260.

Therefore, the second, fourth and third transmission lines TLIN2, TLIN4, TLIN3 may form a three-quarter wavelength transmission line between an output terminal of the second sub-amplifier 230 and the power supply $V_{dd}$, such that a short-circuit load is presented at the output terminal of the second sub-amplifier 230 for both even and odd order harmonics.

The load modulation network 240 completes an impedance transformation from the output terminals of the first and second amplifiers 220, 230 to specific low impedance $Z_m$ for fundamental load modulation at the junction node, i.e. the second interconnection node 260 or the output terminal of the power amplifier arrangement 200. The fundamental component of both sub-amplifiers will be sum up and fundamentally load modulated with the assist of the fourth transmission line TLIN4 as impedance inverter in a classic Doherty PA.

Then a broadband impedance transformer may be used to transform the low output impedance to typical load impedance, e.g. 50Ω. The broadband impedance transformer may be placed after the Doherty PA summing node, which is not limited to use the same technology of the output matching network of Doherty PA. Before the impedance transformer, there may be an offset line with the same input impedance of the broadband impedance transformer. The function of it is to place a transmission line of electrical length θ in series with the broadband impedance transformer. This tuning may be used to compensate for the inability to accurately predict the optimum θ offset value, and to effectively adjust it as required to compensate for changes in other circuit characteristics.

Therefore, according to some embodiments, the power amplifier arrangement 200 further comprises an impedance transformer 270 to transfer the lower output impedance of the power amplifier arrangement 200 to 50Ω. $C_{blk}$ is the AC-coupling capacitor to provide DC isolation to the final load.

At the fundamental frequency, the first/main/carrier amplifier and second/peaking amplifier interact in a Doherty way so that the first, second and fourth transmission lines impedance $Z_1$ and $Z_2$, $Z_4$, are set to a proper ratio of an intermediate load impedance $Z_m$ at the second interconnection node, that is the input impedance of the broadband impedance transformer 270. All the odd order harmonics of the first/main sub-amplifier 220 are locally shunted to ground via the third transmission line TLIN3. Because the even order harmonics from the second/peaking sub-amplifier 230 flow through TLIN2, TLIN4 and TLIN3, the even order harmonic standing waves are established on TLIN1 at the drain of the first/main sub-amplifier 220. These even order harmonics "square" the main amplifier drain current waveform due to the kind of harmonic load modulation effect.

In practice, limited harmonic orders will be counted. Since the 2nd and the 3rd order harmonics are the strongest and most practical ones, they are considered in concept verification and comparison with the prior art.

Table 1 lists the comparison with the prior art features to show the key differentiations between the present embodiments and the prior art.

TABLE 1

|  | Prior art | Present embodiment |
| --- | --- | --- |
| Class of main amplifier after harmonic load modulation | Class-F | Class-F$^{-1}$ |
| Even harmonic @ Drain of main amplifier | Short | Open |
| Odd harmonic @ Drain of Main amplifier | Open | Short |
| Even harmonic @ Final output | Short by λ/A | Short by 3 λ/4 |
| Odd Harmonic @ Final Output | Short by λ/2 | Short by λ/2 |
| Wavelength to Short Even Harmonic | λ/4 | 3 λ/4 |
| Wavelength to Short Odd Harmonic | λ/2 | λ/2 |
| Use separated fundamental and harmonic load modulation schemes? | NO | YES |
| Use quarter wave impedance matching? | NO | YES |

Figure 3:
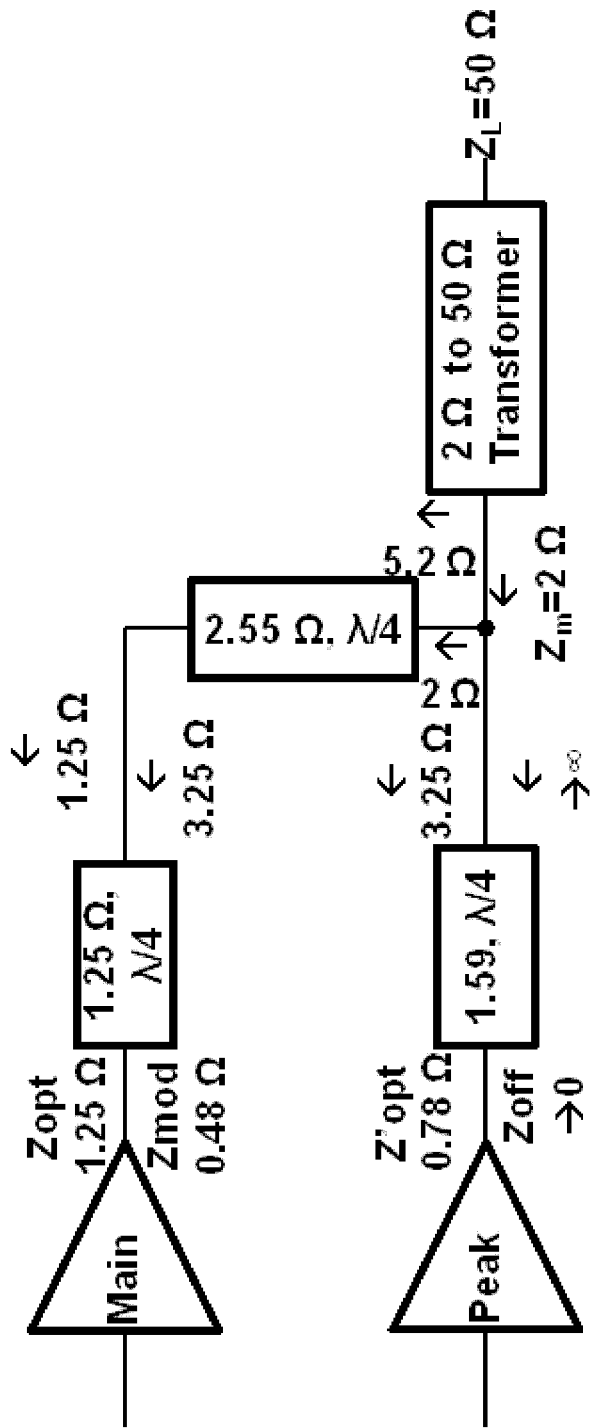
FIG. 3 is a simplified schematic view illustrating an example implementation of a Doherty power amplifier arrangement according to embodiments herein.

FIG. 3 shows an example implementation of the Doherty power amplifier 200 with impedance parameters in low-power and high-power modes respectively, where $Z_0$=1.25 Ohm, r=1.6, VSWR=2.6, $Z_m$=2 Ohm and $Z_L$=50 Ohm. $Z_0$ is the characteristic impedance of the first transmission line, r is the peaking to main power amplifiers power ration, for asymmetric Doherty PA, r>1. VSWR denotes Mismatch Voltage Standing Wave Ratio which equals to (r+1), VSWR>=2. $Z_L$ is the final output load impedance which is typically 50 Ohm. $Z_m$ is the intermediate load impedance at junction node which is typically very low value e.g. 1~6 Ohm.

It should be noted here that $Z_m$ has a particular relationship to $Z_0$ and r values with $Z_m=Z_0*r=1.25*1.6=2$.

In FIG. 3, $Z_{mod}$ and $Z_{opt}$ denote the output impedance seen from the drain of the main sub-amplifier in low-power and high-power modes, respectively.

$Z_{off}$ and $Z'_{opt}$ denote the output impedance seen from the drain of the peaking sub-amplifier in low-power and high-power modes, respectively.

Assume $Z_{off}$ approaches to zero impedance, which indicates the scenario that is suitable to use inverted Doherty PA topology.

To summarize, according to embodiments herein, some advantages of the Doherty power amplifier 100 include:

It provides broadband fundamental and harmonic load modulation at the same time to boost efficiency without any traditional harmonic termination schemes by using very low impedance combination and singular broadband impedance transformer. The load modulation network is used to enhance the off-state impedance for the peaking amplifier by special arrangement for impedance transformers. The impedance relations between the transmission lines in the load modulation network guarantee much easier matching the output impedance seen from the drain of carrier/main amplifier in low-power and high-power modes, i.e. $Z_{mod}$ and $Z_{opt}$, and the output impedance seen from the drain of the peaking amplifier in low power and high-power modes, i.e. $Z_{off}$ and $Z'_{opt}$, simultaneously in a single output matching network.

It highly uses the $2^{nd}$ harmonic rather than the $3^{rd}$ harmonic in prior art to take full advantage and more obvious efficiency enhancement. Usually, the even harmonics, especially the $2^{nd}$ harmonic may contribute a lot for harmonic termination. However, it was shorted to ground in prior art. It would be a kind of waste of resource. It incorporates the broadband harmonic load modulation network and the output matching networks together for a compact Doherty PA design. By using this topology, the offset line after the main/carrier amplifier may be completely removed so that compact design can be realized. Also the impedance inverter can be partially absorbed by the output matching network of the peaking amplifier which can minimize the size of the Doherty amplifier implementation.

The embodiments herein may be applied to even Doherty, uneven Doherty, symmetric Doherty, asymmetric Doherty, inverted Doherty and multistage Doherty power amplifers.

Figure 4:
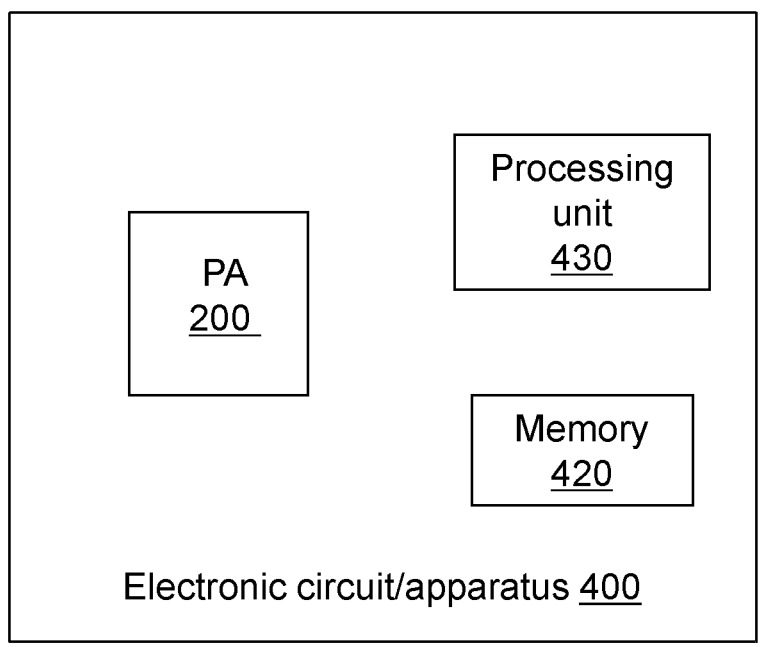
FIG. 4 is a block diagram illustrating an electronic circuit or apparatus in which embodiments herein may be implemented.

The Doherty power amplifier arrangement 200 according to the embodiments herein may be employed in various electronic circuits or apparatuses. FIG. 4 shows a block diagram for an electronic circuit or apparatus 400. The electronic circuit or apparatus 400 comprises a Doherty power amplifier arrangement 200. The electronic circuit or apparatus 400 may be a transmitter or a transceiver in a cellular communications system/network. The electronic apparatus 400 may comprise other units, where a memory 420, a processing unit 430 are shown. The electronic apparatus 400 may be a user equipment or a mobile device, a wireless communication device, a radio base station for a cellular communication system.

Those skilled in the art will understand that the Doherty power amplifier arrangement 200 according to embodiments herein may be implemented by any semiconductor technology.

When using the word "comprise" or "comprising" it shall be interpreted as non-limiting, i.e. meaning "consist at least of".

The embodiments herein are not limited to the above described embodiments. Various alternatives, modifications and equivalents may be used. Therefore, the above embodiments should not be taken as limiting the scope of the embodiments herein, which is defined by the appended claims.

The invention claimed is:

1. A power amplifier comprising:
   a splitter network configured to split an input signal into a first input signal and a second input signal;
   a first amplifier path comprising at least a first sub-amplifier configured to amplify the first input signal and a first output matching network;
   a second amplifier path comprising at least a second sub-amplifier configured to amplify the second input signal and a second output matching network; and
   a load modulation network, wherein the load modulation network comprises:
   a first transmission line coupled between the first output matching network and a first interconnection node;
   a second transmission line coupled between the second output matching network and a second interconnection node;
   a third transmission line coupled between the first interconnection node and a power supply; and
   a fourth transmission line coupled between the first interconnection node and the second interconnection node; wherein each transmission line is a quarter wavelength line at a fundamental frequency of the input signal and wherein the second interconnection node is an output terminal of the power amplifier.

2. The power amplifier according to claim 1, wherein the first transmission line has a characteristic impedance of $Z_0$, the second transmission line has a characteristic impedance of $Z_0 \cdot \sqrt{VSWR/r}$, the fourth transmission line has a characteristic impedance of $Z_0 \sqrt{VSWR \cdot r}$, and wherein the first, second and fourth transmission lines are combined to realize an impedance conversion such that the output terminal of the power amplifier arrangement has a characteristic impedance of $Z_m = Z_0 \cdot r$, which is lower than 50Ω, and the off-state output impedance of the second sub-amplifier is increased with a ratio of VSWR·r, wherein r is a power ratio of the second sub-amplifier to the first sub-amplifier and VSWR is mismatch Voltage Standing Wave Ratio which equals to (r+1).

3. The power amplifier according to claim 2 further comprising an impedance transformer to transfer the lower output impedance of the power amplifier to 50Ω.

4. The power amplifier according to claim 1, wherein the first and third transmission lines form a half wavelength transmission line between an output terminal of the first sub-amplifier and the power supply, such that a short-circuit load is presented at the output terminal of the first sub-amplifier for odd order harmonics, and the second and fourth transmission lines form a half wavelength transmission line such that an open-circuit load is presented at the output terminal of the first sub-amplifier for even order harmonics.

5. The power amplifier according to claim 1, wherein the second, fourth and third transmission lines form a three quarter wavelength transmission line between an output terminal of the second sub-amplifier and the power supply, such that a short-circuit load is presented at the output terminal of the second sub-amplifier for both even and odd order harmonics.

6. An electronic circuit including a power amplifier comprising:
   a splitter network configured to split an input signal into a first input signal and a second input signal;
   a first amplifier path comprising at least a first sub-amplifier configured to amplify the first input signal and a first output matching network;
   a second amplifier path comprising at least a second sub-amplifier configured to amplify the second input signal and a second output matching network; and
   a load modulation network, wherein the load modulation network comprises:
   a first transmission line coupled between the first output matching network and a first interconnection node;
   a second transmission line coupled between the second output matching network and a second interconnection node;
   a third transmission line coupled between the first interconnection node and a power supply; and
   a fourth transmission line coupled between the first interconnection node and the second interconnection node; wherein each transmission line is a quarter wavelength line at a fundamental frequency of the input signal and wherein the second interconnection node is an output terminal of the power amplifier.

7. An apparatus including a power amplifier comprising:
   a splitter network configured to split an input signal into a first input signal and a second input signal;
   a first amplifier path comprising at least a first sub-amplifier configured to amplify the first input signal and a first output matching network;
   a second amplifier path comprising at least a second sub-amplifier configured to amplify the second input signal and a second output matching network; and
   a load modulation network, wherein the load modulation network (240) comprises:
   a first transmission line coupled between the first output matching network and a first interconnection node;
   a second transmission line coupled between the second output matching network and a second interconnection node;
   a third transmission line coupled between the first interconnection node and a power supply; and
   a fourth transmission line coupled between the first interconnection node and the second interconnection node; wherein each transmission line is a quarter wavelength line at a fundamental frequency of the input signal and wherein the second interconnection node is an output terminal of the power amplifier.

8. The apparatus according to claim 7, wherein the apparatus is a wireless communication device for a cellular communication system.

9. The apparatus according to claim 7, wherein the apparatus is a radio base station for a cellular communication system.

10. The electronic circuit according to claim 6, wherein the first transmission line has a characteristic impedance of $Z_0$, the second transmission line has a characteristic impedance of $Z_0 \cdot \sqrt{VSWR/r}$, the fourth transmission line has a characteristic impedance of $Z_0 \cdot \sqrt{VSWR \cdot r}$, and wherein the first, second and fourth transmission lines are combined to realize an impedance conversion such that the output terminal of the power amplifier arrangement has a characteristic impedance of $Z_m = Z_0 \cdot r$, which is lower than 50Ω, and the off-state output impedance of the second sub-amplifier is increased with a ratio of VSWR·r, wherein r is a power ratio of the second sub-amplifier to the first sub-amplifier and VSWR is mismatch Voltage Standing Wave Ratio which equals to (r+1).

11. The electronic circuit according to claim 10 further comprising an impedance transformer to transfer the lower output impedance of the power amplifier to 50Ω.

12. The electronic circuit according to claim 6, wherein the first and third transmission lines form a half wavelength transmission line between an output terminal of the first sub-amplifier and the power supply, such that a short-circuit load is presented at the output terminal of the first sub-amplifier for odd order harmonics, and the second and fourth transmission lines form a half wavelength transmission line such that an open-circuit load is presented at the output terminal of the first sub-amplifier for even order harmonics.

13. The electronic circuit according to claim 6, wherein the second, fourth and third transmission lines form a three quarter wavelength transmission line between an output terminal of the second sub-amplifier and the power supply, such that a short-circuit load is presented at the output terminal of the second sub-amplifier for both even and odd order harmonics.

14. The apparatus according to claim 7, wherein the first transmission line has a characteristic impedance of $Z_0$, the second transmission line has a characteristic impedance of $Z_0 \cdot \sqrt{VSWR/r}$, the fourth transmission line has a characteristic impedance of $Z_0 \cdot \sqrt{VSWR \cdot r}$, and wherein the first, second and fourth transmission lines are combined to realize an impedance conversion such that the output terminal of the power amplifier arrangement has a characteristic impedance of $Z_m = Z_0 \cdot r$, which is lower than 50Ω, and the off-state output impedance of the second sub-amplifier is increased with a ratio of VSWR·r, wherein r is a power ratio of the second sub-amplifier to the first sub-amplifier and VSWR is mismatch Voltage Standing Wave Ratio which equals to (r+1).

15. The apparatus according to claim 14 further comprising an impedance transformer to transfer the lower output impedance of the power amplifier to 50Ω.

16. The apparatus according to claim 7, wherein the first and third transmission lines form a half wavelength transmission line between an output terminal of the first sub-amplifier and the power supply, such that a short-circuit load is presented at the output terminal of the first sub-amplifier for odd order harmonics, and the second and fourth transmission lines form a half wavelength transmission line such that an open-circuit load is presented at the output terminal of the first sub-amplifier for even order harmonics.

17. The apparatus according to claim 7, wherein the second, fourth and third transmission lines form a three quarter wavelength transmission line between an output terminal of the second sub-amplifier and the power supply, such that a short-circuit load is presented at the output terminal of the second sub-amplifier for both even and odd order harmonics.

18. The power amplifier of claim 1, wherein the power amplifier is a Doherty power amplifier.

19. The electronic circuit of claim 6, wherein the power amplifier is a Doherty power amplifier.

20. The apparatus of claim 7, wherein the power amplifier is a Doherty power amplifier.

* * * * *